United States Patent [19]
Heimbigner

[11] 3,962,701
[45] June 8, 1976

[54] CODED COUNTING SEQUENCE AND LOGIC IMPLEMENTATION THEREOF TO DRIVE A DISPLAY PATTERN

[75] Inventor: Gary L. Heimbigner, Anaheim, Calif.

[73] Assignee: Rockwell International Corporation, El Segundo, Calif.

[22] Filed: Dec. 23, 1974

[21] Appl. No.: 535,642

[52] U.S. Cl. ............................. 340/336; 58/50 R; 235/92 EA; 307/220 R; 307/223 R; 328/41; 328/43
[51] Int. Cl.² .................. G06K 15/18; H03K 21/18
[58] Field of Search ................... 340/336; 58/50 R; 235/92 EA; 328/41, 43; 307/220 R, 223 R

[56] References Cited
UNITED STATES PATENTS

| | | | |
|---|---|---|---|
| 2,853,238 | 9/1958 | Johnson | 328/43 |
| 3,400,388 | 9/1968 | Blank | 340/336 X |
| 3,485,033 | 12/1969 | Koehler et al. | 58/50 R |
| 3,541,543 | 11/1970 | Crawford et al. | 340/336 X |
| 3,548,328 | 12/1970 | Breikss | 328/41 |
| 3,639,740 | 2/1972 | Escoffier et al. | 328/43 |
| 3,777,471 | 12/1973 | Koehler et a. | 58/50 R |
| 3,820,108 | 6/1974 | Luce | 340/336 |
| 3,836,903 | 9/1974 | Lawrence | 340/336 |

*Primary Examiner*—David L. Trafton
*Attorney, Agent, or Firm*—H. Fredrick Hamann; G. Donald Weber, Jr.; Morland Charles Fischer

[57] ABSTRACT

An integrated circuit is disclosed providing the logic to generate a unique binary coded numerical counting sequence and a corresponding decoded segment select sequence to subsequently activate particular segments comprising a display pattern at predetermined times. A minimum number of logic input terms and respective logic gates are required to implement the instant sequence to thereby reduce the space consumed by the circuit and the cost thereof.

17 Claims, 5 Drawing Figures

CODED COUNTING SEQUENCE AND LOGIC IMPLEMENTATION THEREOF TO DRIVE A DISPLAY PATTERN

BACKGROUND OF THE INVENTION

1. Field of the Invention

This invention relates generally to improved synchronous display pattern control circuitry which utilizes relatively simplified counter and respective decoder logic for the mechanization thereof.

2. Description of Prior Art

Integrated circuit electronic display modules such as those utilized, for example, in an electronic calculator or in a digital watch, generally require a coded counting sequence to drive particular segments comprising a decimal digit of the display at predetermined times. Frequently, a decade counter and a respective decoder circuit are employed for generating and for subsequently decoding the sequence. The counter usually counts in a well known monotonically increasing binary coded sequence from zero through nine. Hence, a coded counter logic and a corresponding decoded segment logic are developed. Implementation of the input terms for the conventional counter and the respective segment decoder logic is accomplished through a relatively large number of logic devices and relatively complex circuitry. The foregoing results in relatively slow operating speeds, increased space consumption and high costs of production of the display circuit.

SUMMARY OF THE INVENTION

Briefly, and in general terms, an integrated circuit is disclosed to provide the logic for controlling the generation of a unique binary coded numerical counting sequence to drive at predetermined times segmented characters, such as the decimal digits which comprise a display pattern. The circuit includes a binary coded decimal counter and a respective decimal decoder. In a preferred embodiment, the unique coded counting sequence is provided by an arrangement including a first R-S flip-flop counter stage which is comprised of at least three flip-flops and is implemented as a generalized shift register. A second R-S flip-flop counter stage is comprised of at least one flip-flop that is connected to the first counter stage and has operating characteristics of a toggle flip-flop. Each flop-flop comprising the first flip-flop counter stage shift register is provided with an input clock signal, so as to cause the operation thereof to be relatively synchronous. The binary coded output signals from the output terminals of the flip-flops comprising the first and second counter flip-flop stages are supplied to input terminals of the logic which mechanizes the respective segment select decoder. By virtue of the instant invention, the counter and decoder logic are mechanized by a minimum number of components. Consequently, a relatively simplified circuit arrangement is realized which will consume a minimum amount of space and have a reduced cost thereof as compared to the conventional display pattern logic circuits.

BRIEF DESCRIPTION OF THE DRAWINGS

FIG. 1b shows the corresponding Veitch diagrams for the segment select sequence derived from the truth table of FIG. 1a;

DESCRIPTION OF THE PREFERRED EMBODIMENT

Figure 1A:
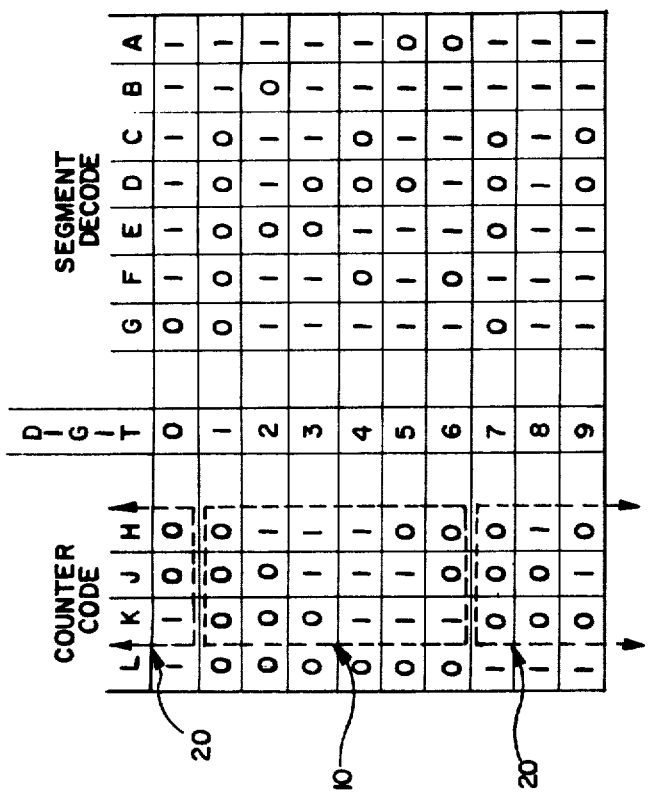
FIG. 1a shows a truth table for the binary coded counter and the corresponding decimal decoded segment select numerical sequences of the instant invention for driving a segmented display pattern.
Figure 1D:
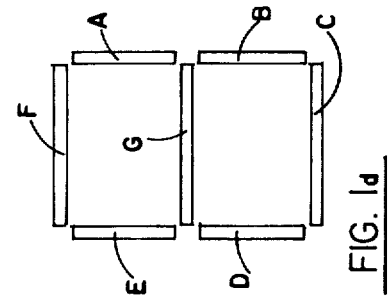
FIG. 1d shows a display pattern decimal digit comprised of a plurality of segments to be selectively activated in accordance with the unique coded counting and corresponding decoded segment sequences of the instant invention.

FIG. 1a shows a truth table of the unique coded numerical counting and related decoded segment select drive control sequences of the instant invention. The headings conveniently designated A through G represent the seven segments which comprise a typical decimal display digit. The digit and its respective segments are best shown in FIG. 1d. The headings conveniently designated H through L represent the unique counting sequence of the instant invention. In order to illuminate the representation of any decimal digit 0 through 9 by means of the display pattern of FIG. 1d, particular digit segments or groups of segments must be activated concurrently in accordance with the instant coded counting sequence and the corresponding decoded segment drive sequence of FIG. 1a.

In the past, conventional display pattern counting sequences have generally been monotonically increasing binary sequences. Consequently, the mechanization of logic corresponding to the conventionally coded counting sequences and to the respective decoded segment select sequences has required a relatively large number of logic gates arranged in a rather complex circuit. The logic of the coded counting sequence and the respective decoded segment sequence of the instant invention can be mechanized by a minimum number of logic gates in a relatively simplified circuit arrangement (to be described in greater detail hereinafter in FIG. 2).

More particularly, decimal display digits 1 through 6 of the instant binary coded numerical counting sequence form a pattern 10 which may be represented by a conventional Johnson counter mode (shown dotted). Decimal digits 7 through 9 and 0 of the instant binary coded counting sequence form a pattern 20 which may be represented by a conventional ring counter mode (also shown dotted). The coded counting sequence is completed by prefixing each binary number comprising the Johnson counting mode 10 by a binary zero and by prefixing each binary number comprising the ring counter mode 20 by a binary one (as illustrated under the L heading).

Figure 1B:
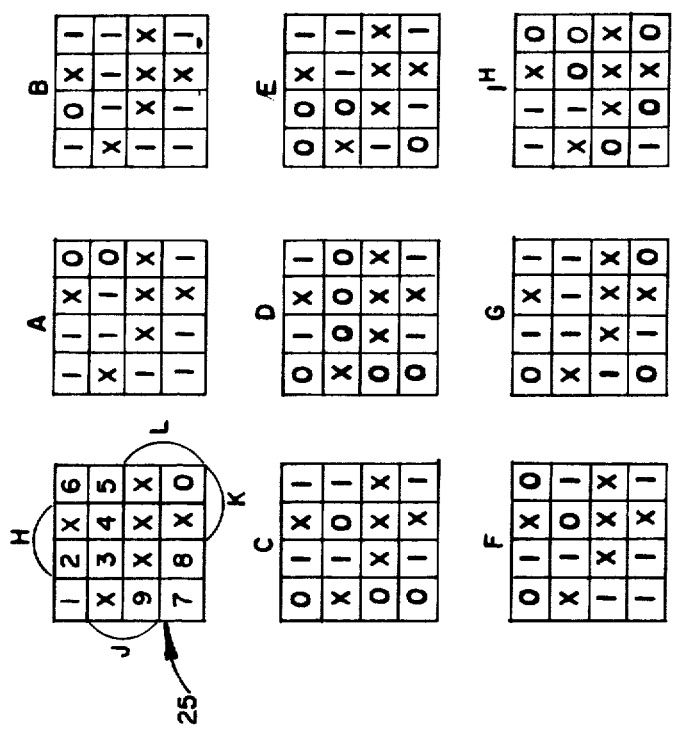

FIG. 1b shows the well known Veitch diagrams corresponding to the decoder segment logic derived from the truth table of FIG. 1a. The particular Veitch diagram designated 25 provides the conventional notation for completing the remaining Veitch diagrams A through G by a well known technique. The Veitch diagrams A through G correspond to the respective segments which comprise a decimal digit or the like of a display pattern (best shown in FIG. 1d) and to the coded pattern shown in FIG. 1a. Since, in the preferred display pattern, there are only ten decimal digits to be represented by the Veitch diagrams (i.e. 0 through 9), the remaining six positions therein are designated by an X. The binary states of these positions so designated are not considered to be pertinent to the instant coded sequences and may thus be indicative of a "don't care" condition.

Figure 1C:
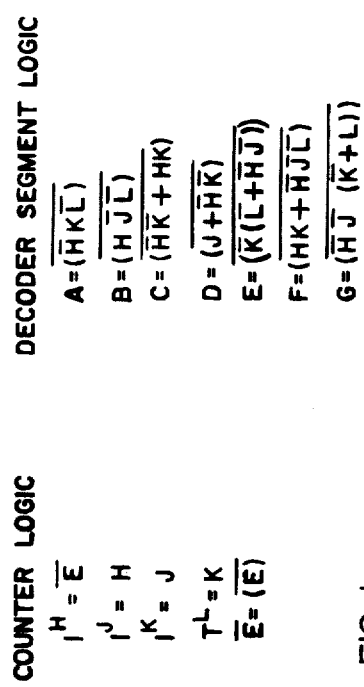
FIG. 1c shows the simplified counter logic equations and the respective segment select logic equations of the instant invention which have been derived from the truth table of FIG. 1a and from the Veitch diagrams of FIG. 1b, respectively.

FIG. 1c shows the simplified counter logic equations and the corresponding decoder segment logic equations which have been derived from the truth table of FIG. 1a and from the Veitch diagrams of FIG. 1b, respectively. The aforementioned logic equations and the relatively simplified circuit which can be utilized for the mechanization thereof are made feasible by virtue of the coded counting sequence of the instant invention.

FIG. 1d shows the respective segments A through G which comprise, in a preferred embodiment, a decimal digit of a display pattern. Each of the respective digit segments A through G are activated in accordance with the logic equations of the instant invention shown in FIG. 1c. The digit illustrated in FIG. 1d may, in a preferred embodiment, comprise the display pattern of a digital watch. However, the invention is not to be regarded as limited thereto. The unique coded sequence and corresponding logic equations derived therefrom may be utilized to drive any display pattern, such as, for example, the pattern of an electronic calculator display, a digital volt meter or any digital panel meter. Moreover, the segments may represent liquid crystal devices (LCD), light-emitting diodes (LED) or the like.

Figure 2:
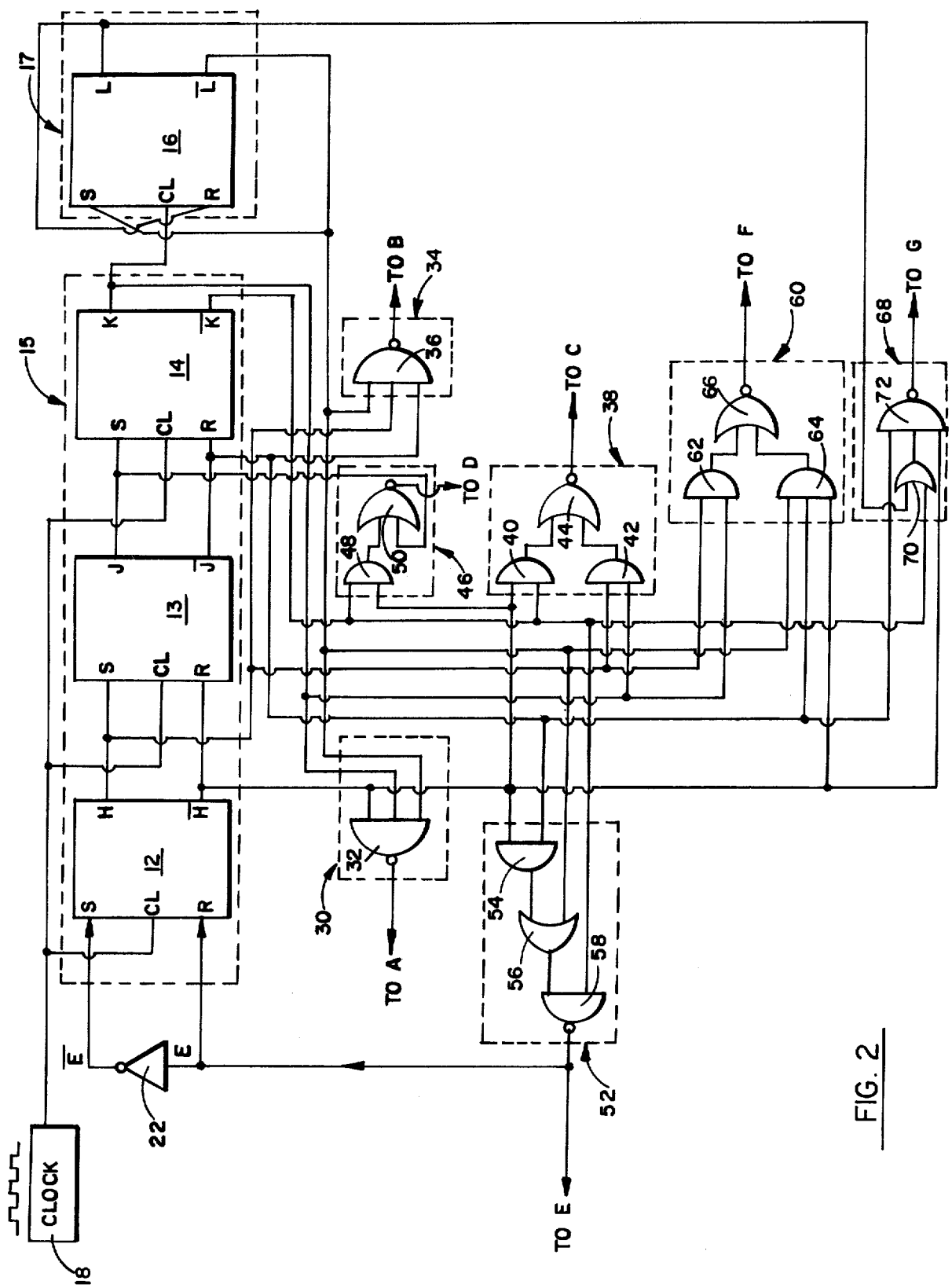
FIG. 2 shows a circuit arrangement for mechanizing the unique counter logic and segment select logic equations of FIG. 1c.

FIG. 2 shows the instant simplified circuit arrangement for mechanizing the unique counter logic and decoder segment select logic of the instant invention. The circuit is comprised of first and second binary coded decimal counter stages 15 and 17, respectively. Because of the unique counting sequence of the instant invention, illustrated in FIG. 1a, the first counter stage 15 may be implemented as a generalized shift register. First counter stage 15 is comprised of flip-flops 12, 13 and 14. The output terminals of flip-flop 12, which provide the designated H and $\overline{H}$ binary coded counting signals, are connected to the respective input terminals S and R of flip-flop 13. The output terminals of flip-flop 13, which provide the designated J and $\overline{J}$ binary coded counting signals, are connected to the respective input terminals S and R of flip-flop 14 which produces the K and $\overline{K}$ binary coded counting signals. The H, J, K signals (and complements thereof) are defined relative to FIGS. 1a, 1b and 1c. The output terminals of first counter stage flip-flops 12, 13 and 14 are also connected to respective input terminals of the gating arrangements comprising the decoder segment select logic of the instant invention, as will be explained in more detail hereinafter. The flip-flops 12, 13 and 14 comprising the first counter stage shift register 15 are connected in an interactive relationship so as to generate the binary coded Johnson counting sequence during those periods of time corresponding to the activation of decimal digits 1 through 6, as described in pattern 10 of the truth table of FIG. 1a.

The output terminal of flip-flop 14, which provides the designated K binary coded counting signal, is connected to the clock input terminal of flip-flop 16 which forms the second counter stage 17. The output terminals of flip-flop 16, which provide the designated L and $\overline{L}$ binary coded counting signals, are connected in a cross-coupled feedback network to respective input terminals R and S of flip-flop 16. The output terminals of the second counter stage flip-flop 16 are also connected to respective input terminals of the gating arrangement comprising the decoder segment select logic of the instant invention, as will be explained in more detail hereinafter. By connecting the first flip-flop stage 15 to the second flip-flop stage 17, the counter will thereafter also be adapted to generate the binary coded ring counting sequence during those periods of time corresponding to the activation of decimal digits 7 through 9 and 0, as described in pattern 20 of the truth table of FIG. 1a.

In a preferred embodiment, flip-flops 12, 13 and 14 may be conventional R-S flip-flops. Flip-flops 16 may also be a conventional R-S flip-flop. However, because of the cross-coupled connection of the feedback network to the input terminals thereof, flip-flop 16 has the operating characteristics of a T or a toggle flip-flop.

Clock signals are supplied from a suitable source 18 to the respective clock input terminals of flip-flops 12, 13 and 14 which comprise the first counter flip-flop stage 15. The clock signals result in the instant counter circuitry having a relatively synchronous operation, an advantage of which is to avoid the formation of electrical spikes at the output terminals of the counter flip-flops.

As illustrated, the binary coded signals from the respective flip-flop output terminals of counter stages 15 and 17 provide the binary input signals to be supplied to the input terminals of the gates comprising the corresponding decoder segment select logic in order to selectively drive each respective segment A through G. The decoder segment select logic is implemented in a convenient mode corresponding to the logic of the equations developed in FIG. 1c. It is to be understood, however, that the instant segment decoder logic may be mechanized in other convenient forms. That which is illustrated has been done for exemplary purposes only.

More particularly, the decoder gating arrangement 30 for mechanizing the logic to selectively activate the segment of display designated A includes NAND gate 32. As illustrated, the output terminal of flip-flop 12 providing the binary $\overline{H}$ signal is connected to one input terminal of NAND gate 32. The output terminal of flip-flop 14 providing the binary K signal is connected to a second input terminal of NAND gate 32. The output terminal of flip-flop 16 providing the binary $\overline{L}$ signal is connected to a third input terminal of NAND gate 32. Hence, the logic implemented by the gating arrangement 30 corresponds to the Boolean expression ($\overline{H}K\overline{L}$) shown in FIG. 1c. This signal, A, is then applied to the character segment A shown in FIG. 1d whereby this segment is selectively energized in accordance with the signals supplied to gate 32.

The decoder gating arrangement 34 for mechanizing the logic to selectively activate the segment of display designated B includes NAND gate 36. The output terminal of flip-flop 16 providing the binary L signal is connected to a first input terminal of NAND gate 36. The output terminal of flip-flop 12 providing the binary H signal is connected to a second input terminal of NAND gate 36. The output terminal of flip-flop 13 providing the binary $\overline{J}$ signal is connected to a third input terminal of NAND gate 36. Hence, the logic implemented by the gating arrangement of 34 corresponds to the Boolean expression ($\overline{HJL}$) shown in FIG. 1c.

The decoder gating arrangement 38 for mechanizing the logic to selectively activate the segment of display designated C includes first and second AND gates 40 and 42 and NOR gate 44. The output terminal of flip-flop 12 providing the binary $\overline{H}$ signal is connected to a first input terminal of AND gate 40. The output terminal of flip-flop 14 providing the binary $\overline{K}$ signal is connected to a second input terminal of AND gate 40. The output terminal of flip-flop 12 providing the binary H signal is connected to a first input terminal of AND gate 42. The output terminal of flip-flop 14 providing the binary K signal is connected to a second input terminal of AND gate 42. The output terminals of AND gates 40 and 42 are connected to respective first and second input terminals of NOR gate 44, as shown. Hence, the logic implemented by gating arrangement 38 corresponds to the Boolean expression ($\overline{HK}$+HK) shown in FIG. 1c.

The decoder gating arrangement 46 for mechanizing the logic to selectively activate the segment of display designated D includes AND gate 48 and NOR gate 50. The output terminal of flip-flop 14 providing the binary $\overline{K}$ signal is connected to a first input terminal of AND gate 48. The output terminal of flip-flop 12 providing the binary $\overline{H}$ signal is connected to a second input terminal of AND gate 48. The output terminal of AND gate 48 is connected to a first input terminal of NOR gate 50. The output terminal of flip-flop 13 providing the binary J signal is connected to a second input terminal of NOR gate 50. Hence, the logic implemented by the gating arrangement 46 corresponds to the Boolean expression ($\overline{J+\overline{H}\overline{K}}$) shown in FIG. 1c.

The decoder gating arrangement 52 for mechanizing the logic to selectively activate the segment of display designated E includes AND gate 54, OR gate 56 and NAND gate 58. The output terminal of flip-flop 12 providing the binary $\overline{H}$ signal is connected to a first input terminal of AND gate 54. The output terminal of flip-flop 13 providing the binary $\overline{J}$ signal is connected to a second input terminal of AND gate 54. The output terminal of AND gate 54 is connected to a first input terminal of OR gate 56. The output terminal of flip-flop 16 providing the binary $\overline{L}$ signal is connected to a second input terminal of OR gate 56. The output terminal of OR gate 56 is connected to a first input terminal of NAND gate 58. The output terminal of flip-flop 14 providing the binary $\overline{K}$ signal is connected to a second input terminal of NAND gate 58. Hence, the logic implemented by the gating arrangement 52 corresponds to the Boolean expression ($\overline{\overline{K}(\overline{L}+\overline{H}\overline{J})}$) shown in FIG. 1c.

The counting sequence of the instant invention may be repetitively generated by connecting the output terminal of NAND gate 58 to input terminal R of flip-flop 12, via inverter-amplifier gate 22, and to an input terminal S of flip-flop 12, as shown.

The decoder gating arrangement 60 for mechanizing the logic to selectively activate the segment of display designated F includes first and second AND gates 62 and 64 and NOR gate 66. The output terminal of flip-flop 12 providing the binary H signal is connected to a first input terminal of AND gate 62. The output terminal of flip-flop 14 providing the binary K signal is connected to a second input terminal of AND gate 62. The output terminal of flip-flop 16 providing the binary $\overline{L}$ signal is connected to a first input terminal of AND gate 64. The output terminal of flip-flop 13 providing the binary $\overline{J}$ signal is connected to a second input terminal of AND gate 64. The output terminal of flip-flop 12 providing the binary $\overline{H}$ signal is connected to a third input terminal of AND gate 64. The output terminals of first and second AND gates 62 and 64 are connected to respective first and second input terminals of NOR gate 66. Hence, the logic implemented by the gating arrangement 60 corresponds to the Boolean expression ($\overline{HK+\overline{H}\overline{J}\overline{L}}$) shown in FIG. 1c.

The decoder gating arrangement 68 for mechanzing the logic to selectively activate the segment of display designated G includes an OR gate 70 and a NAND gate 72. The output terminal of flip-flop 16 providing the binary L signal is connected to a first input terminal of OR gate 70. The output terminal of flip-flop 14 providing the binary $\overline{K}$ signal is connected to a second input terminal of OR gate 70. The output terminal of flip-flop 13 providing the binary $\overline{J}$ signal is connected to a first input terminal of NAND gate 72. The output terminal of OR gate 70 is connected to a second input terminal of NAND gate 72. The output terminal of flip-flop 12 providing the binary $\overline{H}$ signal is connected to a third input terminal of NAND gate 72. Hence, the logic implemented by the gating arrangement 68 corresponds to the Boolean expression ($\overline{\overline{H}\overline{J}(\overline{K}+L)}$) shown in FIG. 1c.

By virtue of the unique coded counting sequence of the instant invention, relatively fewer Boolean input terms are required by the decoder segment select logic of FIG. 2 in order to drive a display pattern compared with that corresponding to conventional decade counters and respective decoders. Hence, the circuit which mechanizes the counter and decoder logic of the instant invention is relatively simpler and requires fewer components than the circuitry of the prior art. Moreover, the operating speed of the instant circuitry can be maximized to realize savings of space and cost.

It will be apparent that while a preferred embodiment of the invention has been shown and described, various modifications and changes may be made without departing from the true spirit and scope of the invention. For example, while the flip-flops which comprise both the first counter stage 15 and the second counter stage 17 have been described in a preferred embodiment as R-S flip-flops, it is within the scope of the instant invention that the first and second flip-flop stages be comprised of any other suitable, well-known flip-flops. Such suitable flip-flops may include an appropriate J-K flip-flop, D flip-flop, and the like.

Having thus set forth a preferred embodiment of the invention, what is claimed is:

1. In combination,
   first counter means having input and output terminal means,
   second counter means having a plurality of input and output terminal means, at least one of said input terminal means of said second counter means connected to said output terminal means of said first counter means to receive signals therefrom,
   each of said plurality of output terminal means of said second counter means connected in a cross-coupled feedback network to said plurality of input terminal means of said second counter means to provide complementary feedback signals thereto,
   logic means connected to receive signals from said output terminal means of both said first and second counter means and to produce a plurality of output signals representative of the signals produced by said first and second counter means, and feedback means connected from said logic means to the input terminal means of said first counter means.

2. The combination recited in claim 1 wherein
said first counter means produces a plurality of signals and the complements thereof, and
said second counter means produces a signal and the complement thereof.

3. The combination recited in claim 1, wherein at least one of said plurality of input terminal means of said second counter means includes a clock input terminal, said output terminal means of said first counter means connected to said clock input terminal.

4. The combination recited in claim 1, wherein said feedback means includes an inverter-amplifier means.

5. The combination recited in claim 1, wherein said first counter means comprises a plurality of bistable devices interconnected in an interactive relationship with respect to one another,
each of said bistable devices having respective input and output terminal means, and
clock signal means connected to said respective input terminal means of each of said plurality of bistable devices.

6. The combination recited in claim 1, including display means comprising a plurality of segments,
each of said segments selectively connected to said logic means in order to receive at least one of said plurality of output signals produced by said logic means.

7. The combination recited in claim 6, wherein said logic means is connected to receive said signals from said output terminal means of said first counter means and to produce a plurality of respective signals for driving selected ones of said display segments, and
said logic means is connected to receive said signals from said output terminal means of said first and said second counter means and to produce a plurality of respective signals from driving other selected ones of said display segments.

8. The combination recited in claim 1, wherein said logic means is connected to receive signals from each of said output terminal means of both said first and second counter means.

9. A circuit including counter means and decoder means to selectively energize a display pattern comprised of segments A, B, C . . . G
said counter means having at least four bistable devices arranged in an interactive relationship with respect to one another in order to produce a sequence of binary signals,
a first bistable device having first and second output terminals connected to input terminals of said decoder means so as to provide respective complementary binary signals represented by H and $\overline{H}$,
a second bistable device having third and fourth output terminals connected to input terminals of said decoder means so as to provide respective complementary binary signals represented by J and $\overline{J}$,
a third bistable device having fifth and sixth output terminals connected to input terminals of said decoder means so as to provide respective complementary binary signals represented by K and $\overline{K}$,
a fourth bistable device having seventh and eight output terminals connected to input terminals of said decoder means so as to provide respective complementary binary signals represented by K and $\overline{K}$, and
said decoder means including logic means having input terminals adapted to receive said complementary signals from said counter means bistable devices, said decoder means producing a plurality of output signals in response to the sequence of binary signals produced by said counter means in order to selectively energize said segments A, B, C . . . G according to the following relationships between said segments and said binary signals produced at the output terminals of said first, second, third and fourth bistable devices:

$A = (\overline{HKL})$
$B = (\overline{HJL})$
$C = (\overline{HK}+HK)$
$D = (\overline{J+HK})$
$E = (\overline{K(L+HJ)})$
$F = (\overline{HK+HJL})$
$G = (\overline{HJ(K+L)})$.

10. The circuit of claim 9,
the first and second output terminals of said first bistable device connected to third and fourth input terminals of said second bistable device,
the third and fourth output terminals of said second bistable device connected to fifth and sixth input terminals of said third bistable device,
the fifth output terminal of said third bistable device connected to a respective clock input terminal of said fourth bistable device to provide for the synchronous operation thereof.

11. The circuit of claim 9, the seventh and eight output terminals of said fourth bistable device connected in a cross-coupled network to provide respective complementary binary feedback signals to seventh and eighth input terminals of said fourth bistable device.

12. The circuit of claim 9 including clock signal means, said clock signal means connected to a respective clock input terminal of each of said first, second and third bistable devices to provide for the synchronous operation thereof.

13. The circuit of claim 9, including an inverter means having an input terminal and an output terminal,
an output terminal of said decoder logic means connected to said inverter input terminal and to a second input terminal of said first bistable device,
the output terminal of said inverter means connected to a first input terminal of said first bistable device.

14. The circuit of claim 9, wherein the interactive relationship of said first, second and third bistable devices comprises a shift register.

15. The circuit of claim 9, wherein each of said at least four bistable devices is an R-S type flip-flop.

16. The circuit of claim 9, wherein said fourth bistable device is a toggle-type flip-flop.

17. The circuit recited in claim 9, wherein said sequence of binary signals produced by the interactive relationship of said at least four bistable devices includes a Johnson counting sequence and a ring counting sequence.

* * * * *